US012676681B2

(12) United States Patent
Feng et al.

(10) Patent No.: US 12,676,681 B2
(45) Date of Patent: Jul. 7, 2026

(54) TRANSCEIVER BUILT-IN SELF-TEST

(71) Applicant: QUALCOMM INCORPORATED, San Diego, CA (US)

(72) Inventors: Yunfei Feng, San Diego, CA (US); Li Liu, San Diego, CA (US); Chuan Wang, San Diego, CA (US); Vahid Dabbagh Rezaei, San Diego, CA (US); Vinod Panikkath, San Diego, CA (US); Alaaeldien Mohamed Abdelrazek Medra, San Diego, CA (US); Anosh Davierwalla, San Diego, CA (US); Xinmin Yu, San Diego, CA (US); Muhammad Hassan, San Diego, CA (US); Wu-Hsin Chen, San Diego, CA (US); Sherif Hassan Kamel Embabi, Allen, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/611,179

(22) Filed: Mar. 20, 2024

(65) Prior Publication Data
US 2025/0007624 A1 Jan. 2, 2025

Related U.S. Application Data

(60) Provisional application No. 63/511,487, filed on Jun. 30, 2023, provisional application No. 63/511,072, filed on Jun. 29, 2023.

(51) Int. Cl.
*H04B 17/00* (2015.01)
*H03F 3/195* (2006.01)
(Continued)

(52) U.S. Cl.
CPC ......... *H04B 17/0085* (2013.01); *H03F 3/195* (2013.01); *H04B 1/40* (2013.01); *H03F 2200/294* (2013.01); *H04B 2001/0408* (2013.01)

(58) Field of Classification Search
CPC . G01S 31/317; G01S 7/35; G01S 7/40; G01S 13/02; H03F 1/02; H03F 3/19; (Continued)

(56) References Cited

U.S. PATENT DOCUMENTS

| 9,628,203 B2 | 4/2017 | Weissman et al. |
| 2014/0256376 A1* | 9/2014 | Weissman .............. H04B 17/14 |
| | | 455/550.1 |

(Continued)

FOREIGN PATENT DOCUMENTS

| EP | 3114782 | 1/2017 |
| EP | 3512127 A1 | 7/2019 |
| WO | 2015134519 | 9/2015 |

OTHER PUBLICATIONS

International Search Report and Written Opinion—PCT/US2024/032234—ISA/EPO—Oct. 4, 2024.

*Primary Examiner* — Shawkat M Ali
(74) *Attorney, Agent, or Firm* — Smith Tempel Blaha LLC/Qualcomm

(57) ABSTRACT

A method of self-testing a transceiver integrated circuit substrate includes: providing a test signal to a transmission line that is communicatively coupled, or selectively communicatively coupled, to an input of a power amplifier of a first transceiver subcircuit of the transceiver integrated circuit substrate; providing the test signal from the transmission line to an LNA of an LNA of a second transceiver subcircuit of the transceiver integrated circuit substrate; and (Continued)

measuring the test signal before amplification by the LNA, or after amplification by the LNA, or both.

18 Claims, 6 Drawing Sheets

(51) Int. Cl.
    *H04B 1/40*         (2015.01)
    *H04B 1/04*         (2006.01)
(58) Field of Classification Search
    CPC . H03F 3/21; H03F 3/195; H03F 3/213; H04B
                  1/04; H04B 1/40; H04B 3/46; H04B
            17/00; H04B 17/19; H04B 17/21; H04B
              17/24; H04B 17/0085; H04L 25/02;
                                H04L 27/36
    USPC ...... 375/219, 224, 295–297, 316; 455/67.11,
                          455/73, 126, 425, 550.1
    See application file for complete search history.

(56)                 References Cited

U.S. PATENT DOCUMENTS

| | | |
|---|---|---|
| 2021/0044459 A1 | 2/2021 | Raclaw et al. |
| 2021/0116501 A1 | 4/2021 | Martineau et al. |
| 2022/0140479 A1* | 5/2022 | Kimball ................. H01Q 3/267 |
| | | 343/702 |

\* cited by examiner

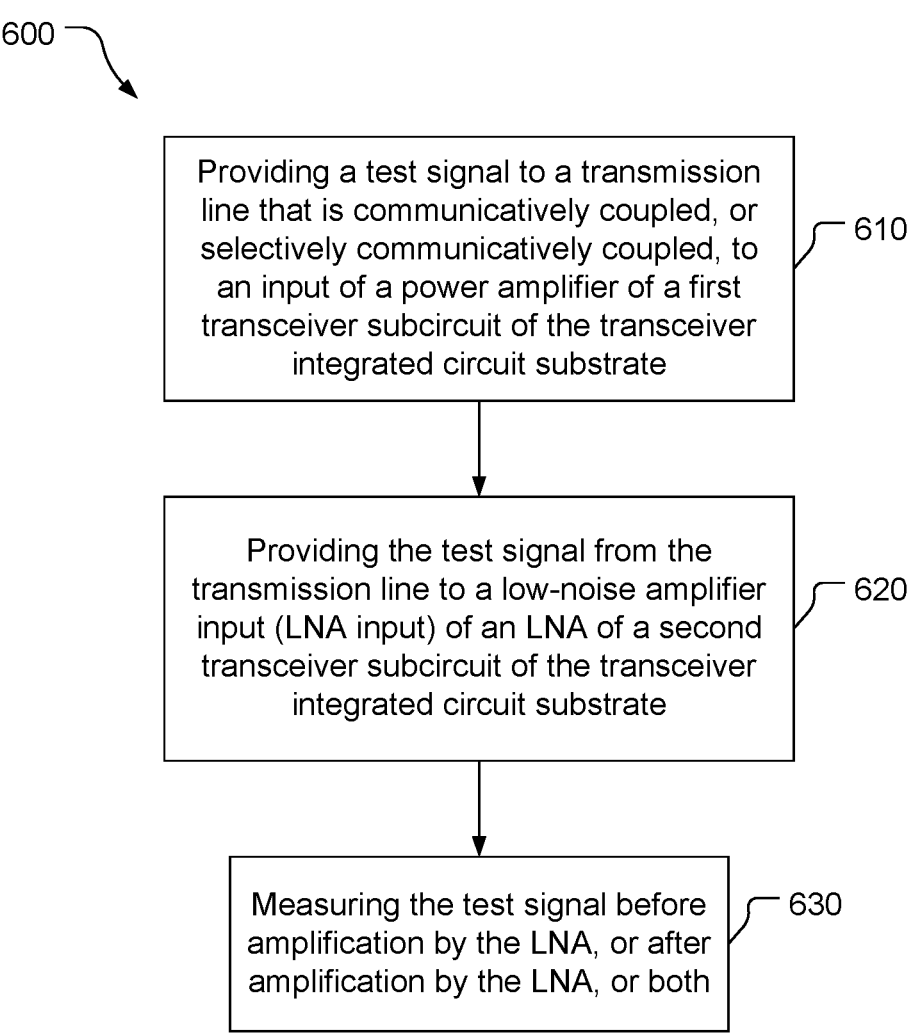

600

Providing a test signal to a transmission line that is communicatively coupled, or selectively communicatively coupled, to an input of a power amplifier of a first transceiver subcircuit of the transceiver integrated circuit substrate — 610

Providing the test signal from the transmission line to a low-noise amplifier input (LNA input) of an LNA of a second transceiver subcircuit of the transceiver integrated circuit substrate — 620

Measuring the test signal before amplification by the LNA, or after amplification by the LNA, or both — 630

FIG. 6

TRANSCEIVER BUILT-IN SELF-TEST

CROSS-REFERENCE TO RELATED APPLICATIONS

This application claims the benefit of U.S. Provisional Application No. 63/511,072, filed Jun. 29, 2023, entitled "TRANSCEIVER BUILT-IN SELF-TEST," and claims the benefit of U.S. Provisional Application No. 63/511,487, filed Jun. 30, 2023, entitled "TRANSCEIVER BUILT-IN SELF-TEST," both of which are assigned to the assignee hereof, and the entire contents of both of which are hereby incorporated herein by reference for all purposes.

BACKGROUND

Wireless communication devices are increasingly popular and increasingly complex. For example, mobile telecommunication devices have progressed from simple phones, to smart phones with multiple communication capabilities (e.g., multiple cellular communication protocols, Wi-Fi, BLUETOOTH® and other short-range communication protocols), supercomputing processors, cameras, etc. Wireless communication devices have antennas to support various functionality such as communication over a range of frequencies, reception of Global Navigation Satellite System (GNSS) signals, also called Satellite Positioning Signals (SPS signals), etc.

With several antennas disposed in a single wireless communication device, available volume for antennas is at a premium. For example, smartphones may have numerous antennas (e.g., eight antennas, 10 antennas, or more) with very limited volume due to the size of devices that consumers desire. Consequently, antenna assemblies (e.g., modules) may be limited to very small volumes, e.g., with widths of 4 mm or less.

Despite the volume restrictions for antennas, desired functionality of the antennas continues to increase. With the advent of $5^{th}$ generation (5G) of wireless communication technology, mmW (millimeter-wave) phased array antennas have received extensive attention to address the propagation loss and aperture blockage hurdles by introducing higher antenna gain and beamforming features. Multiple-input-multiple-output (MIMO) systems is one of the key enablers of 5G technology to increase the spectral efficiency and system capacity by effectively streaming the transmit/receive data with two orthogonally polarized signals (cross-polarized signals) in desired directions. The trend in consumer electronics is to develop RF (Radio Frequency) assemblies (radio frequency assemblies) with small form factors which can be easily accommodated within the limited space of the emerging smart devices including cell phones and tablets. The physical requirements of antennas make maintaining or improving performance (e.g., in terms of coverage, latency, and quality of service over desired coverage area) difficult.

Production of wireless communication devices, including millimeter-wave integrated circuit (IC) production, is costly in terms of test procedures, equipment, and testing time. On-chip built-in self-test (BIST) circuitry may reduce cost, including testing time, but presents challenges to enable accurate test results.

SUMMARY

An example transceiver integrated circuit substrate with built-in self-test circuitry includes: a transmission-signal source configured to produce a test signal; a first transceiver subcircuit including a power amplifier that includes a power-amplifier input that is communicatively coupled, or selectively communicatively coupled, to a transmission line that is communicatively coupled to the transmission-signal source to receive the test signal and that includes a power-amplifier output communicatively coupled to a first input/output of the transceiver integrated circuit substrate; a second transceiver subcircuit including a low-noise amplifier (LNA) that includes an LNA input communicatively coupled to a second input/output of the transceiver integrated circuit substrate; a feedback circuit that is configured to selectively communicatively couple the transmission line to the LNA input of the second transceiver subcircuit; test circuitry communicatively coupled to the LNA input of the second transceiver subcircuit, or communicatively coupled to an LNA output of the LNA of the second transceiver subcircuit, or a receive chain intermediate frequency output, or any combination of two or more thereof; and a controller communicatively coupled to the transmission-signal source, the first transceiver subcircuit, the second transceiver subcircuit, and the feedback circuit, and configured to cause the feedback circuit to communicatively couple the transmission line of the first transceiver subcircuit to the LNA input of the second transceiver subcircuit.

An example method of self-testing a transceiver integrated circuit substrate includes: providing a test signal to a transmission line that is communicatively coupled, or selectively communicatively coupled, to an input of a power amplifier of a first transceiver subcircuit of the transceiver integrated circuit substrate; providing the test signal from the transmission line to a low-noise amplifier input (LNA input) of an LNA of a second transceiver subcircuit of the transceiver integrated circuit substrate; and measuring the test signal before amplification by the LNA, or after amplification by the LNA, or both.

Another example transceiver integrated circuit substrate with built-in self-test circuitry includes: means for providing a test signal to a transmission line that is communicatively coupled, or selectively communicatively coupled, to an input of a power amplifier of a first transceiver subcircuit of the transceiver integrated circuit substrate; means for providing the test signal from the transmission line to a low-noise amplifier input (LNA input) of an LNA of a second transceiver subcircuit of the transceiver integrated circuit substrate; and means for measuring the test signal before amplification by the LNA, or after amplification by the LNA, or both.

An example non-transitory, processor-readable storage medium includes processor-readable instructions to cause one or more processors, of a transceiver integrated circuit substrate with built-in self-test circuitry, to: cause a signal source to provide a test signal to a transmission line that is communicatively coupled, or selectively communicatively coupled, to an input of a power amplifier of a first transceiver subcircuit of the transceiver integrated circuit substrate; and cause a feedback circuit to provide the test signal from the transmission line to a low-noise amplifier input (LNA input) of an LNA of a second transceiver subcircuit of the transceiver integrated circuit substrate.

BRIEF DESCRIPTION OF THE DRAWINGS

FIG. 6 is block flow diagram of a method of self-testing a transceiver integrated circuit substrate.

DETAILED DESCRIPTION

Techniques are discussed herein for built-in self-test of an integrated circuit, e.g., a millimeter-wave transceiver integrated circuit substrate. For example, a test signal may be produced by a synthesizer and provided to transmit circuitry that includes a power amplifier (PA). A feedback circuit may selectively direct the test signal to a selected low-noise amplifier of receive circuitry of the transceiver. The power amplifier and the low-noise amplifier may be disposed in different transceiver subcircuits, e.g., for different frequency bands and/or different signal polarizations. The power amplifier and the low-noise amplifier may be disposed in different portions of an integrated circuit substrate, e.g., proximate to opposite edges of the integrated circuit substrate. The power amplifier may be inhibited from producing an output signal based on the test signal, e.g., by being turned off and/or by having a switch of the feedback circuit direct the test signal to other portions of the feedback circuit and prevent the test signal from reaching the power amplifier (e.g., due to the switch disconnecting the power amplifier from a signal feed). The test signal may be measured by test circuitry before and/or after being amplified by the low-noise amplifier. A path may be coupled between an input of a power amplifier (e.g., output of a phase shifter) in one circuit and a power detector at a bump (input/output port) in another circuit. The circuits may be in different layers (e.g., circuitry for different polarizations). The path may be a loopback path used for built-in self test/characterization. Other configurations, however, may be used.

Items and/or techniques described herein may provide one or more of the following capabilities, as well as other capabilities not mentioned. An integrated circuit (IC) substrate may have a self-test function and thus performance of the IC substrate may be self-tested and production cost (e.g., testing time) may be reduced, e.g., without using external equipment. Integrated circuit substrate built-in self-test accuracy may be improved, e.g., by reducing or even eliminating leakage of a power amplifier output signal into receive circuitry. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

The discussion herein focuses on communication systems, and in particular mmW communication systems. The techniques discussed herein, however, may be used for other applications.

Figure 1:
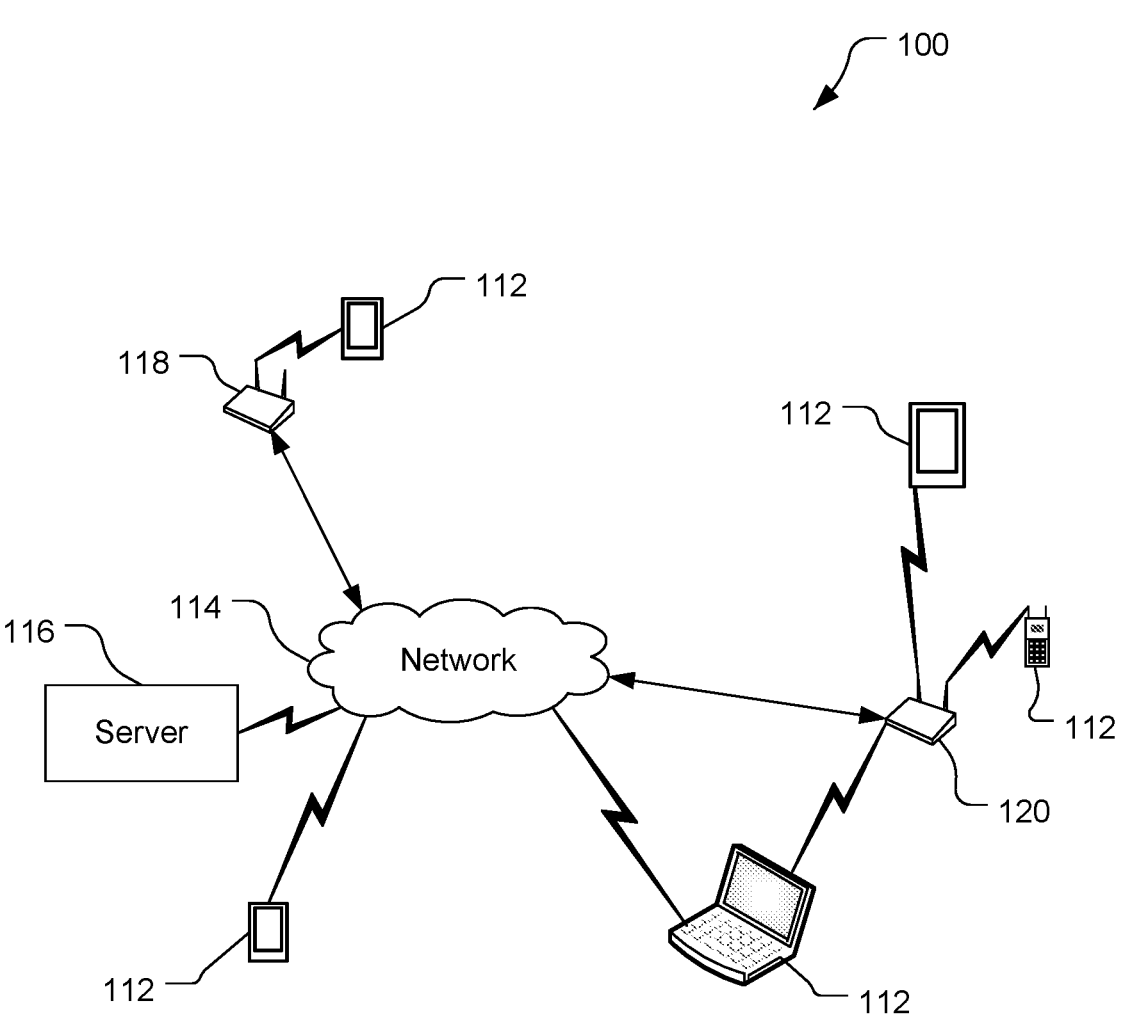
FIG. 1 is a schematic diagram of a communication system.

Referring to FIG. 1, a communication system 100 includes mobile devices 112, a network 114, a server 116, and access points (APs) 118, 120. The communication system 100 is a wireless communication system in that components of the communication system 100 can communicate with one another (at least sometimes) using wireless connections directly or indirectly, e.g., via the network 114 and/or one or more of the access points 118, 120 (and/or one or more other devices not shown, such as one or more base transceiver stations). For indirect communications, the communications may be altered during transmission from one entity to another, e.g., to alter header information of data packets, to change format, etc. The mobile devices 112 shown are mobile wireless communication devices (although they may communicate wirelessly and via wired connections) including mobile phones (including smartphones), a laptop computer, and a tablet computer. Still other mobile devices may be used, whether currently existing or developed in the future. Further, other wireless devices (whether mobile or not) may be implemented within the communication system 100 and may communicate with each other and/or with the mobile devices 112, network 114, server 116, and/or APs 118, 120. For example, such other devices may include internet of thing (IoT) devices, medical devices, home entertainment and/or automation devices, automotive devices, etc. The mobile devices 112 or other devices may be configured to communicate in different networks and/or for different purposes (e.g., 5G, Wi-Fi communication, multiple frequencies of Wi-Fi communication, satellite communication and/or positioning, one or more types of cellular communications (e.g., GSM (Global System for Mobiles), CDMA (Code Division Multiple Access), LTE (Long-Term Evolution), etc.), Bluetooth® communication, etc.). Each of the mobile devices 112 may be referred to as a user equipment (UE).

As used herein, the term "user equipment" and "UE" are not specific to or otherwise limited to any particular Radio Access Technology (RAT), unless otherwise noted. In general, UEs may be any wireless communication device (e.g., a mobile phone, router, tablet computer, laptop computer, consumer asset tracking device, Internet of Things (IoT) device, etc.) used by a user to communicate over a wireless communications network. A UE may be mobile or may (e.g., at certain times) be stationary, and may communicate with a Radio Access Network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile terminal," a "mobile station," a "mobile device," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, WiFi networks (e.g., based on IEEE (Institute of Electrical and Electronics Engineers) 802.11, etc.) and so on. Further, two or more UEs may communicate directly in some configurations with or without passing information to each other through a network.

Figure 2:
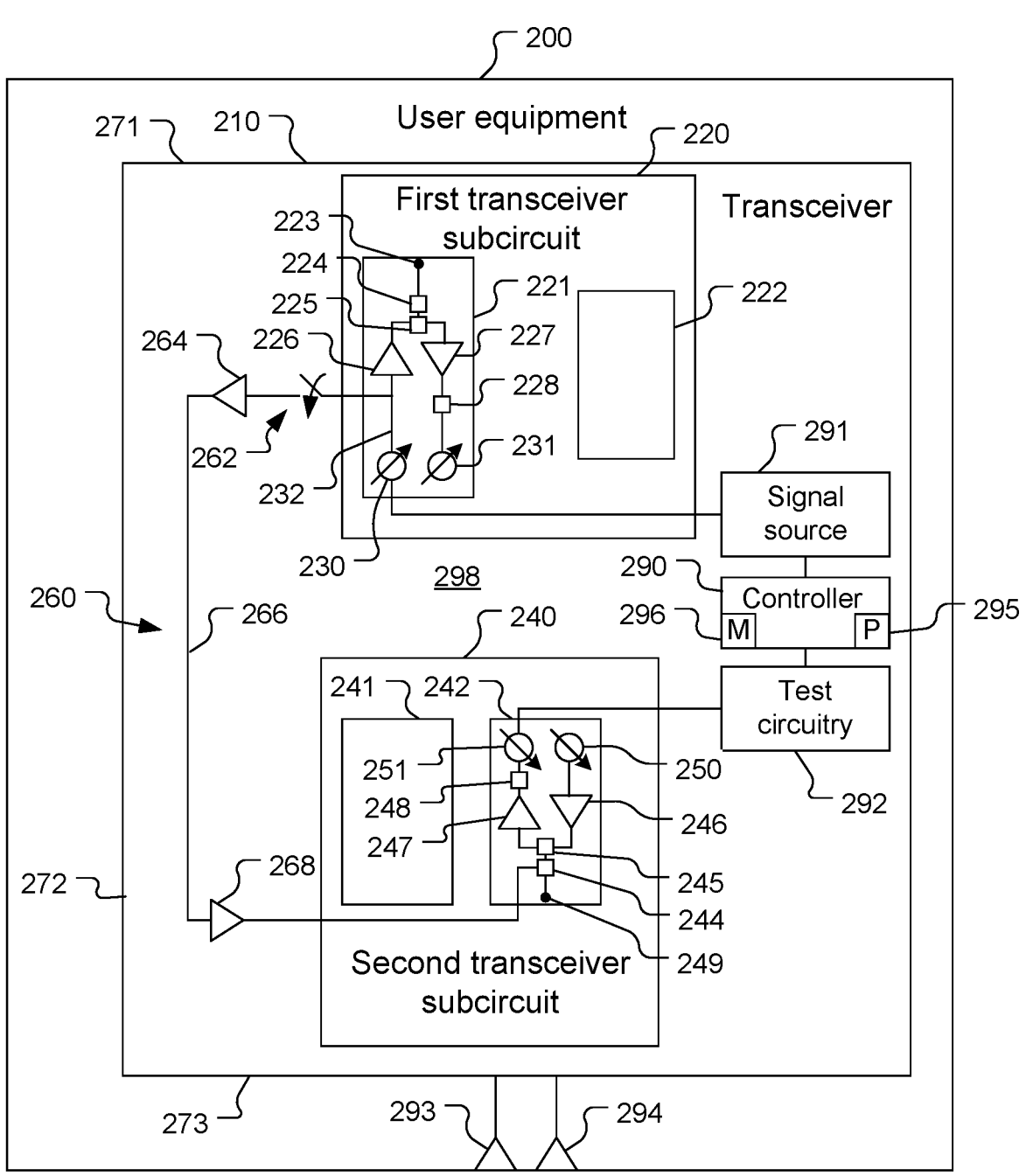
FIG. 2 is a block diagram of a transceiver of a user equipment.

Referring to FIG. 2, a UE 200 includes a transceiver 210 that includes a first transceiver subcircuit 220, a second transceiver subcircuit 240, a feedback circuit 260, a controller 290, a signal source 291, and test circuitry 292. The UE 200 is an example, and other configurations of UEs (or other devices) may be used, including other configurations of the transceiver 210. The transceiver 210 comprises an integrated circuit (IC) substrate formed, e.g., from silicon (and/or one or more other semiconductors) and one or more conductors. The transceiver 210 may be configured for transmitting and receiving communication signals, e.g., millimeter-wave communication signals. The transceiver subcircuits 220, 240 may be configured to transmit and receive respective signals, e.g., of different frequencies and/or for different polarizations. For example, the first transceiver subcircuit 220 may be configured for sending and/or receiving horizontal-polarization signals (as sent and received by a horizontally-polarized antenna 293) and the second transceiver subcircuit 240 may be configured for sending and/or receiving vertical-polarization signals (as sent and received by a vertically-polarized antenna 294). The antennas 293, 294 are communicatively coupled to the transceiver subcircuits 220, 240, respectively, and may be implemented as a single antenna with dual polarization. The first transceiver subcircuit 220 and/or the second transceiver subcircuit 240 may be configured to send and receive signals in different frequency bands, e.g., a low mmW band (e.g., 24 GHz-29.5 GHz) and a high mmW band (e.g., 37 GHz-43.5 GHz). For the sake of simplicity of FIG. 2 (and other figures), numerous components are omitted from the figures as well as some connections between components. For example, the controller 290 is communicatively coupled to numerous components, e.g., switches, as discussed herein but these connections are not shown in FIG. 2.

The controller 290 may include a processor 295 and a memory 296. The processor 295 may include the memory 296 or a portion of the memory 296. The test circuitry 292 may comprise the processor 295 or a portion of the processor 295 and/or may comprise dedicated circuitry, e.g., one or more comparators. The processor 295 may include one or more hardware devices, e.g., a central processing unit (CPU), a microcontroller, an application specific integrated circuit (ASIC), etc. The processor 295 may comprise multiple processors including a general-purpose/application processor, a Digital Signal Processor (DSP), etc. The memory 296 may be a non-transitory storage medium that may include random access memory (RAM), flash memory, disc memory, and/or read-only memory (ROM), etc. The memory 296 may store software which may be processor-readable, processor-executable software code containing instructions that may be configured to, when executed, cause the processor 295 to perform various functions described herein. Alternatively, the software may not be directly executable by the processor 295 but may be configured to cause the processor 295, e.g., when compiled and executed, to perform the functions. The description herein may refer to the processor 295 performing a function, but this includes other implementations such as where the processor 295 executes software and/or firmware. The description herein may refer to the processor 295 performing a function as shorthand for one or more processors performing the function. The description herein may refer to the controller 290 performing a function as shorthand for one or more processors of the controller 290 performing the function. The processor 295 may include a memory with stored instructions in addition to and/or instead of the memory 296. The processor 295 may include one or more processors. The memory 296 may include one or more memories.

The first transceiver subcircuit 220 includes antenna element subcircuits 221, 222 each corresponding to a respective antenna element of the antenna 293. While two antenna element subcircuits 221, 222 are shown in FIG. 2, other quantities of antenna element subcircuits may be used. The antenna element subcircuit 221 includes a port 223, a coupler/measurement unit 224, a shared load transformer 225, a power amplifier 226, an LNA 227, a measurement unit 228, a phase shifter 230, and a phase shifter 231. The port 223 is an interface between the antenna element subcircuit 221 and other circuitry (e.g., the antenna 293) and may comprise an electrically-conductive pad configured to be placed onto a solder bump on a printed circuit board. The port 223 is an input/output of the transceiver 210, an output of the power amplifier 226, and an input of the LNA 227. The phase shifter 230 is communicatively coupled to the power amplifier 226 (to an input of the power amplifier 226) by a transmission line 232. The power amplifier 226 is communicatively coupled to the transmission line 232, which is communicatively coupled to the signal source 291 to receive a test signal. The transmission line 232 may comprise multiple lines and the input of the power amplifier 226 may comprise multiple inputs, but the transmission line 232 is shown as a single line for sake of simplicity of the figure. The phase shifter 230 is communicatively coupled to the signal source 291. The signal source 291 may be a transmission-signal source configured to produce a test signal, that is a test transmission signal. The signal source 291 may provide the test signal to the transmission line 232 via the phase shifter 230. The signal source 291 may, for example, be a combination of synthesizers, e.g., as discussed with respect to FIG. 4. Other configurations of an antenna element subcircuit may be used. For example, the measurement unit 228 may be omitted.

The second transceiver subcircuit 240 includes antenna element subcircuits 241, 242 each corresponding to a respective antenna element of the antenna 294. While two antenna element subcircuits 241, 242 are shown in FIG. 2, other quantities of antenna element subcircuits may be used. The antenna element subcircuit 242 includes a coupler/measurement unit 244, a shared load transformer 245, a power amplifier 246, an LNA 247, a measurement unit 248, an input/output 249, a phase shifter 250, and a phase shifter 251. The test circuitry 292 is communicatively coupled to the phase shifter 251, the coupler/measurement unit 244 and the measurement unit 248, and the test circuitry 292 may determine one or more values, e.g., receiver gain, based on a signal from the phase shifter 251 and/or one or more values provided by the coupler/measurement unit 244 and/or the measurement unit 248. Other configurations of an antenna element subcircuit may be used. For example, the measurement unit 248 may be omitted.

The feedback circuit 260 includes a switch 262, an amplifier 264, a transmission line 266, an amplifier 268, and a coupler of the coupler/measurement unit 244. Inclusion of the two amplifiers 264, 268 is an example, and another amplifier quantity (e.g., zero amplifiers, one amplifier, three amplifiers, etc.) may be used as part of the feedback circuit 260. The feedback circuit 260 is configured to selectively provide a test signal from the transmission line 232 to one or more selected LNAs, e.g., the LNA 247 of the antenna element subcircuit 242. An input of the LNA 247 is communicatively coupled to the input/output 249 to receive signals during normal operation and is communicatively coupled to the coupler of the coupler/measurement unit 244 to receive a test signal. The switch 262 is communicatively coupled to the transmission line 232. The controller 290 is communicatively coupled to the switch 262 and configured to cause the switch 262 to close in a self-test mode (which may be referred to simply as a test mode) of the transceiver 210 to communicatively couple the transmission line 232 to the amplifier 264 (and thus to other portions of the feedback circuit 260). In this example, in the test mode, the feedback circuit 260 directs the test signal provided to an input of the power amplifier 226 to selected receive circuitry of the second transceiver subcircuit 240. The feedback circuit 260, or at least the transmission line 266 of the feedback circuit 260, may extend (e.g., may be disposed) proximate to a perimeter, e.g., proximate to one or more outer edges 271, 272, 273, of (the substrate of) the transceiver 210, or at least without traversing a region 298 between the subcircuits 220, 240, which may help avoid signal leakage into the transmission line 266 and thus possibly improve test signal integrity which may improve measurement accuracy of the test signal.

Other configurations of the transceiver 210 may be implemented. For example, another feedback circuit may be provided to provide a test signal from the second transceiver subcircuit 240 to selected receive circuitry of the first transceiver subcircuit 220 or to another subcircuit of the transceiver 210. As another example, referring also to FIG. 3, an example antenna element subcircuit 300 includes a switch 310 disposed between a phase shifter 320 and a power amplifier 330. In this example, a feedback circuit includes the switch 310 and a controller 340 is communicatively coupled to the switch 310. The controller 340 may be configured to cause the switch 310 to communicatively couple the phase shifter 320 to the power amplifier 330 in a normal operation mode. The controller 340 may be configured to cause the switch 310 to communicatively couple the phase shifter 320 to the amplifier 264, and to disconnect the power amplifier 330 from the phase shifter 320, in a test mode. Thus, in this example, the power amplifier 330 is selectively communicatively coupled to a transmission line 322 that is communicatively coupled to a transmission-signal source (e.g., the signal source 291) to receive a test signal. In the test mode, the power amplifier 330 is inhibited from receiving a test signal provided to the phase shifter 320 by the switch 310, thus providing an open circuit (or nearly an open circuit) between the phase shifter 320 and the power amplifier 330. In the test mode, the input of the power amplifier 330 may be connected to ground (e.g., by the switch 310) and/or the power amplifier 330 may be turned off. The switch 310 may prevent any of the test signal from reaching the power amplifier 330 in the test mode or may prevent all but a small portion of the test signal from reaching the power amplifier 330 in the test mode.

Figure 4:
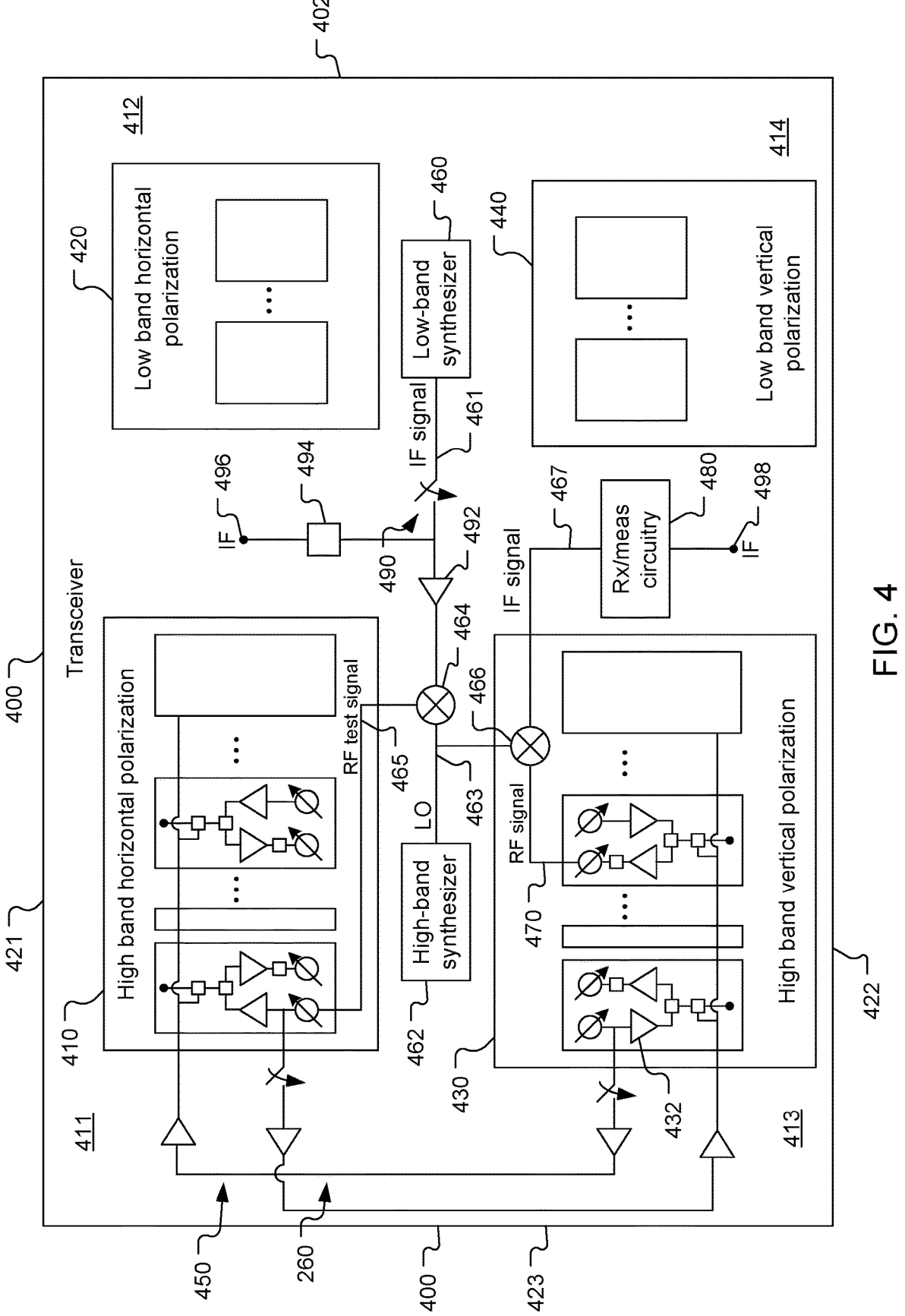
FIG. 4 is a block diagram of an example of the transceiver shown in FIG. 2.

Referring also to FIG. 4, a transceiver 400, which is an example of the transceiver 210, includes a high-band horizontal polarization unit 410, a low-band horizontal polarization unit 420, a high-band vertical polarization unit 430, and a low-band vertical polarization unit 440. The units 410, 420, 430, 440 each comprise respective antenna element subcircuits. The units 410, 420 may be parts of what is called a horizontal layer or "H-layer" and the units 430, 440 may be parts of what is called a vertical layer or "V-layer". The H-layer comprises circuitry for processing (e.g., generating, amplifying, measuring, and/or decoding, etc.) signals corresponding to (e.g., to be transmitted with and/or signals received with) a first polarization. The V-layer comprises circuitry for processing (e.g., generating, amplifying, measuring, and/or decoding, etc.) signals corresponding to a second polarization that is different from, e.g., orthogonal to, the first polarization. In this example, in addition to the feedback circuit 260, the transceiver 400 includes a feedback circuit 450 that is configured to selectively couple a test signal provided to an input of a power amplifier 432 of the high-band vertical polarization unit 430 to one or more receive circuits of the high-band horizontal polarization unit 410. While the feedback circuits 260, 450 are configured to feed back a test signal from one of the high-band polarization units 410, 430 to the other, other feedback circuit configurations may be used. For example, one or more feedback circuits may also or alternatively be provided to feed back a respective test signal from one of the low-band polarization units 420, 440 to the other, or feedback circuits may be configured in a daisy chain.

The polarization units 410, 420, 430, 440 are disposed in respective regions of an IC substrate 402 of the transceiver 400. In this example, the polarization units 410, 420, 430, 440 are disposed in respective quadrants 411, 412, 413, 414 of the IC substrate 402 of the transceiver 400. The polarization units 410, 420, 430, 440 are disposed such that the polarization units 410, 420 are disposed near an edge 421 of the transceiver 400 and the polarization units 430, 440 are disposed near an edge 422 of the transceiver 400, with the edges 421, 422 being opposite edges on opposite sides of the transceiver 400. The polarization units 410, 420, 430, 440 may be configured such that power amplifiers and LNAs of the polarization units 410, 420, 430, 440 are disposed in close proximity to respective edges of the substrate 402 of the transceiver 400. For example, the power amplifier 432 may be disposed adjacent to the edge 422, e.g., within 200 $\mu$m (200 micrometers), e.g., within 100 $\mu$m, of the edge 422. Other configurations may be used. For example, a transceiver may be configured with polarization units disposed near adjacent edges, e.g., the edge 421 and an edge 423.

The transceiver 400 includes a low-band synthesizer 460, a high-band synthesizer 462, and mixers 464, 466. The low-band synthesizer 460, the high-band synthesizer 462, and the mixer 464 may be used as an example of the signal source 291 to produce a test signal. In the test mode, the controller 290 may cause the low-band synthesizer 460 to produce an IF signal 461 (intermediate frequency signal) and selectively provide (via a switch 490) the IF signal 461 through an amplifier 492 to the mixer 464. The IF signal 461 (a BIST IF signal) is sent from the synthesizer 460 through a transmit signal path used for normal operation, for example provided through a path coupled to transmit circuitry 494 and an IF input/output 496 (e.g., a port such as a conductive pad for connection to a solder pad). The controller 290 may cause the high-band synthesizer 462 to provide an LO signal 463 (local oscillator signal) to the mixer 464. The mixer 464 combines the IF signal 461 and the LO signal 463 to form an RF test signal 465 that is a high-band test signal (e.g., that may be provided to the transmission line 232 via the phase shifter 230). Similarly, a low-band test signal could be provided by having the high-band synthesizer 462 provide an IF signal to a mixer, having the low-band synthesizer 460 provide an LO signal to the mixer, and having the mixer combine the IF signal and the LO signal to form an RF signal as the low-band test signal. An output of the mixer 464 (e.g., the high-band test signal) may be coupled to more of the high band horizontal polarization antenna element subcircuits than illustrated (e.g., two or more or all). One or more of these other high band horizontal polarization antenna element subcircuits may be (selectively) coupled to the feedback circuit 260 or a respective feedback circuit (not illustrated). An RF signal 470 output by an LNA as part of a self-test of the transceiver 400 may be provided to the mixer 466. The mixer 466 may use the RF signal 470 and the LO signal 463 to produce an IF signal 467 and provide the IF signal 467 to Rx/meas circuitry 480. The Rx/meas circuitry 480 may comprise Rx circuitry for normal operation of the transceiver 400 and includes measurement circuitry, e.g., a power detector, for a self-test mode. An output of the Rx/meas circuitry 480 may be communicatively coupled to an IF port 498. In a normal operation mode, the controller 290 may control the low-band synthesizer 460 to provide an LO signal.

For sake of simplicity of FIG. 4, circuitry is shown for providing a test signal to the high-band horizontal polarization unit 410 and measuring the test signal fed back from the high-band horizontal polarization unit 410 and received by the high-band vertical polarization unit 430. Similar circuitry (although not shown), e.g., equivalents of the mixer 464, the mixer 466, the Rx/meas circuitry 480 and the transmit circuitry 494, may be provided for providing a test signal to the high-band vertical polarization unit 430 and measuring the test signal fed back from the high-band vertical polarization unit 430 and received by the high-band horizontal polarization unit 410.

Referring again in particular to FIG. 2, the controller 290 may be configured to select which of the antenna element subcircuits will receive and measure a fed-back test signal. For example, the controller 290 may be communicatively coupled to the signal source 291, the first transceiver subcircuit 220, the second transceiver subcircuit 240, and the feedback circuit 260. The controller 290 may be configured to control switches in the antenna element subcircuits (e.g., in the coupler/measurement units 244) such that one of the antenna element subcircuits in the second transceiver subcircuit 240 will receive the fed-back test signal from the first transceiver subcircuit 220 and the other antenna element subcircuits of the second transceiver subcircuit 240 will be inhibited from receiving the fed-back test signal, e.g., for a test mode. For example, a switch may be closed to provide the fed-back test signal to an LNA of a selected antenna element subcircuit while the switches of other antenna element subcircuits will be open to inhibit (possibly prevent) the fed-back test signal from reaching an LNA of each the other antenna element subcircuits, i.e., the antenna element subcircuits selected not to receive the fed-back test signal. For example, the controller 290 may be configured to control one or more switches to cause the feedback circuit 260 to communicatively couple an input of the power amplifier 226 of the first transceiver subcircuit 220 to an input of the LNA 247 of the second transceiver subcircuit 240. Similarly, if a feedback circuit is provided to feed back a test signal from the second transceiver subcircuit 240 to the first transceiver subcircuit 220, then the controller 290 may control switches in the antenna element subcircuits (e.g., in the coupler/measurement units 224) such that one of the antenna element subcircuits in the first transceiver subcircuit 220 will receive the fed-back test signal from the second transceiver subcircuit 240 and the other antenna element subcircuits of the first transceiver subcircuit 220 will be inhibited from receiving the fed-back test signal. The controller 290 may be configured to cause the feedback circuit 260 to uncouple a power-amplifier input (e.g., an input of the power amplifier 226) of the first transceiver subcircuit 220 from an LNA input (e.g., the input of the LNA 247) of the second transceiver subcircuit 240, e.g., for a normal operation mode of the transceiver 210.

The controller 290 may be configured to inhibit the power amplifier 226 from providing an output signal to the output of the power amplifier 226 based on the test signal and, concurrently, cause the feedback circuit 260 to communicatively couple the transmission line 232 to the input of the LNA 247 of the second transceiver subcircuit 240 to provide the test signal to the LNA 247 of the second transceiver circuit 240. The controller 290 may inhibit the power amplifier 226 from providing an output signal to the output of the power amplifier 226 while (and possibly before) causing the feedback circuit 260 to communicatively couple the transmission line 232 to the input of the LNA 247, e.g., to help avoid an output signal from the power amplifier 226 from dominating a measured test signal. To inhibit the power amplifier from providing an output signal to the power-amplifier output based on the test signal, the controller 290 may, for example, be configured to cause the power amplifier 226 to be off. As another example, to inhibit the power amplifier 226 from providing an output signal to the power-amplifier output based on the test signal, the controller 290 may be configured to disconnect a transmission line (e.g., the transmission line 322) from the power-amplifier input.

Figure 5:
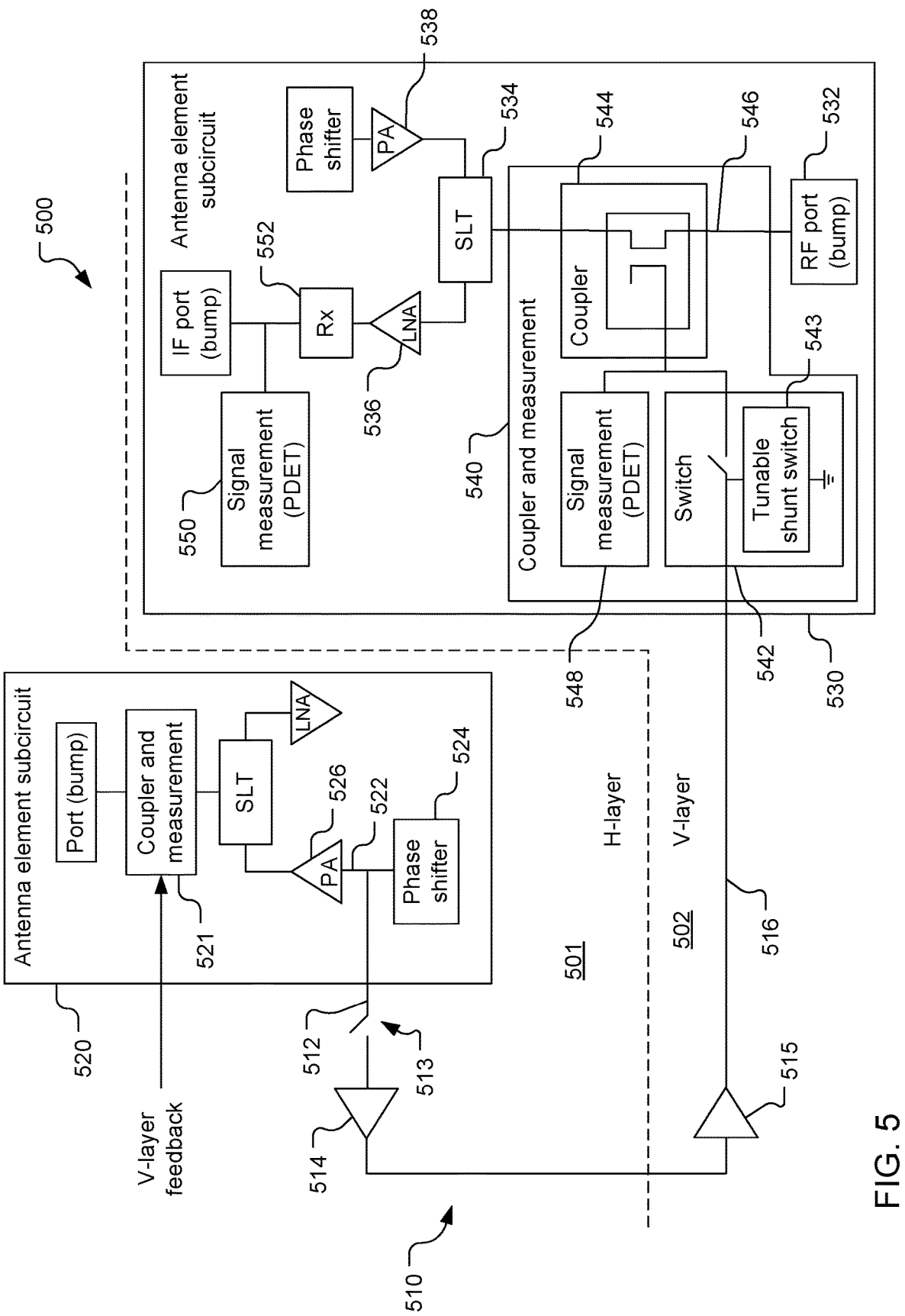
FIG. 5 is a simplified circuit diagram of portions of the transceiver shown in FIG. 4 used for built-in self-test.

Referring also to FIG. 5, a circuit 500 includes a feedback circuit 510, an antenna element subcircuit 520, and an antenna element subcircuit 530. The feedback circuit 510 is an example of the feedback circuit 260. The antenna element subcircuit is an example of the antenna element subcircuit 221, and the antenna element subcircuit 530 is an example of the antenna element subcircuit 242. The antenna element subcircuit 520 is a part of an H-layer 501 of the circuit 500 and the antenna element subcircuit 530 is a part of a V-layer 502 of the circuit 500. The feedback circuit 510 is configured to obtain a test signal in one layer (here the H-layer 501) and provide the test signal to a receive chain of another layer (here the V-layer 502). This may help reduce leakage of a test signal into a receive chain. A coupler and measurement unit 521 of the subcircuit 520 is coupled to a feedback circuit (not shown) that is configured similarly to the feedback circuit 510 to feed back a test signal, fed back from the V-layer 502, to the coupler and measurement unit 521.

Figure 3:
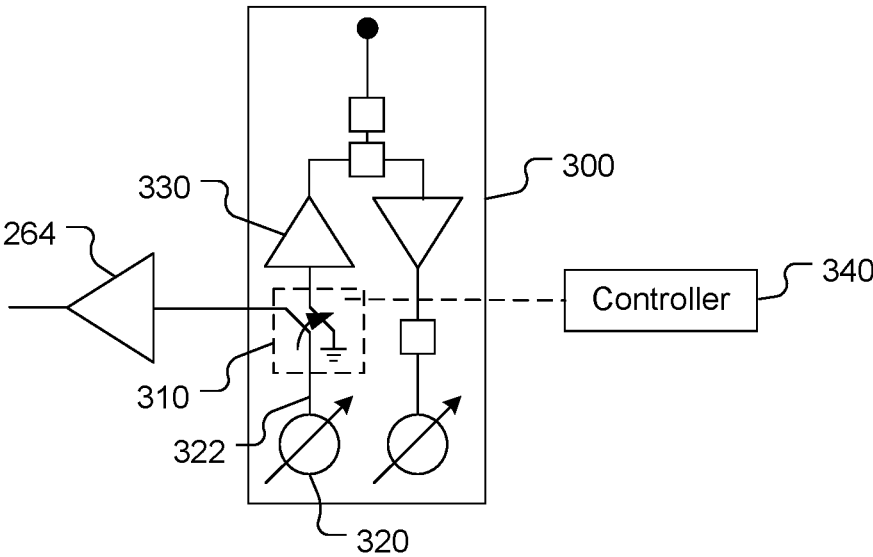
FIG. 3 is a simplified circuit diagram of an alternative feedback switch configuration relative to a configuration shown in FIG. 2.

The feedback circuit 510 is configured to selectively couple an input to a power amplifier 526 of the subcircuit 520 to one or more antenna element subcircuits. In the circuit 500, the feedback circuit 510 includes a line 512 that is selectively coupled to an amplifier 514 by a switch 513 controlled by a controller (e.g., the controller 290), and is coupled to a transmission line 522 that connects a phase shifter 524 of the subcircuit 520 to the power amplifier 526 of the subcircuit 520. The feedback circuit 510 may thus tap a signal to be input to the power amplifier 526. In a test mode, a test signal may be provided to the transmission line 522, the switch 513 controlled to couple the transmission line 522 to the amplifier 514, and concurrently the power amplifier 526 controlled to be OFF. Alternatively, a portion of the feedback circuit 510 may be configured as shown in FIG. 3 to direct a test signal to the amplifier 514 and inhibit the test signal from reaching the power amplifier 526. The feedback circuit 510 may thus tap a test signal without the test signal being supplied to the power amplifier 526. By avoiding the power amplifier 526 providing an output signal based on the test signal during the test mode, leakage of the output signal into a receive chain (e.g., an LNA or LNA chain) may be avoided, which may improve measurement feasibility and accuracy of the test signal. For example, leakage of a signal from a power amplifier through ports (e.g., solder bumps) of the transceiver 210, e.g., one coupled to a power amplifier and another coupled to an LNA, may be reduced or even avoided. The feedback circuit 510 is coupled to obtain a test signal on one end and is coupled to antenna element subcircuits, e.g., the antenna element subcircuit 520, on other ends (which may be called delivery ends).

Each of the antenna element subcircuits on the delivery ends of the feedback circuit 510 may be configured to selectively (e.g., under control of the controller 290) provide a fed-back test signal from the feedback circuit 510 to a respective LNA. For example, a line 516 of the feedback circuit 510 may be coupled to a switch (which may be considered to be part of the feedback circuit 510) in each antenna element subcircuit and may be selectively controlled to connect a line (e.g., a transmission line although possibly referred to herein as simply a line) carrying a test signal to a line communicatively coupled to the respective LNA. In the example shown, the line 516 is coupled to a switch 542 of a coupler and measurement unit 540 of the antenna element subcircuit 530. The switch 542 may be a tuning switch that may include, e.g., a tunable shunt switch 543 connected to ground, such that the switch 542 may tune impedance and signal strength. The tunable shunt switch 543 may include a variable impedance such as a varactor, or one or more impedances (e.g., one or more capacitances and/or one or more inductances), that may be selectively coupled to the line 516. The tunable shunt switch 543 may be omitted from the switch 542 (e.g., one or more of the switches 542 corresponding to one or more LNAs).

A coupler 544 of the coupler and measurement unit 540 is coupled to the switch 542. The coupler 544 may receive a test signal from the switch 542 and couple the test signal to a transmission line 546 that couples an RF port 532 (e.g., a conductive pad configured to be coupled to a solder bump) of the antenna element subcircuit 530 to a shared load transformer 534 (SLT). The shared load transformer 534 is configured to direct an inbound (received) signal from the coupler 544 to an LNA 536 instead of a PA 538.

A test signal may be measured by one or more signal measurement devices and may be measured before and/or after amplification by an LNA of receive circuitry. For example, a signal measurement device 548 of the coupler and measurement unit 540 may be communicatively coupled to an input of the LNA 536 (and an output of the PA 538) and communicatively coupled to the switch 542 to receive the test signal provided by the feedback circuit 510 (or an output of the PA 538 in other optional operations). As the coupler 544 may couple an output of the PA 538 to the signal measurement device 548, the coupler 544 may be called a PA coupler. The signal measurement device 548 may be disposed, as shown, before or upstream from the LNA 536. The signal measurement device 548 may be any of a variety of measurement devices such as a power detector (PDET). The signal measurement device 548 may be a power amplifier PDET for measuring signal power from the PA 538, and thus may be used for measuring a fed-back test signal or for measuring an outgoing transmit signal from the PA 538. The signal measurement device 548 may be said to be a PA PDET re-used for fed-back test signal measurement. As another example, a signal measurement device 550 may be communicatively coupled to an output of the LNA 536, e.g., through receive circuitry 552 as shown, to receive the test signal as amplified by the LNA 536 and processed by the receive circuitry 552. The signal measurement device 550 may be disposed, as shown, after or downstream from the LNA 536. The signal measurement device 550 may be any of a variety of measurement devices such as a power detector (PDET). The signal measurement device 548 and/or the signal measurement device 550 may comprise at least a portion of the test circuitry 292. The feedback circuit 510, e.g., the amplifier 514 and an amplifier 515, is configured such that the test signal as received by the signal measurement device 548 will be in a dynamic range of the signal measurement device 548 and/or such that the test signal as received by the signal measurement device 550 will be in a dynamic range of the signal measurement device 550. The receive circuitry 552 may be configured to convert the RF test signal to an IF signal. For example the receive circuitry 552 may comprise the synthesizer 462 and the mixer 466 shown in FIG. 4.

Referring again in particular to FIG. 2, the test circuitry 292 and/or the processor 295 may be configured to determine whether the transceiver 210 is acceptable. For example, the test circuitry 292 and/or the processor 295 may be communicatively coupled to the signal measurement device 548 and/or the signal measurement device 550 to receive one or more measurements of a test signal provided by the feedback circuit 260 to the antenna element subcircuit 242. The test circuitry 292 and/or the processor 295 may analyze the signal measurement(s) to determine whether the transceiver 210 (e.g., one or more components of the transceiver 210 such as one or more LNAs) pass one or more tests. For example, the test circuitry 292 and/or the processor 295 may determine a receiver gain based on measured signal strength for the LNA input (e.g., measured by the signal measurement unit 548) and measured signal strength of a receive chain IF output (e.g., measured by the signal measurement unit 550). The test circuitry 292 and/or the processor 295 may determine that the transceiver 210 (or a particular receive chain) fails based on, for example, the determined receive gain being outside of a target range of receive gain, or passes based on the determined receive gain being within the target receive gain range. Also or alternatively, receive gain may be determined to be outside the target receive gain range and the difference between the measured receive gain and the target receive gain range may be used for gain calibration. Also or alternatively, transmit signal chain performance, such as droop, may be evaluated and used for characterization and/or calibration. It has been found that performing a BIST using techniques discussed herein provided very accurate receive gain, i.e., receive gain determined during BIST testing was very close to measured gain values.

Referring to FIG. 6, with further reference to FIGS. 1-5, a method 600 of self-testing a transceiver integrated circuit substrate includes the stages shown. The method 600 is, however, an example only and not limiting. The method 600 may be altered, e.g., by having one or more stages added, removed, rearranged, combined, performed concurrently, and/or by having one or more single stages split into multiple stages.

At stage 610, the method 600 includes providing a test signal to a transmission line that is communicatively coupled, or selectively communicatively coupled, to an input of a power amplifier of a first transceiver subcircuit of the transceiver integrated circuit substrate. For example, the signal source 291, as controlled by the controller 290 (e.g., the processor 295 possibly in combination with the memory 296), may provide a test signal to the transmission line 232 that is communicatively coupled to an input of the power amplifier 226. As another example, the signal source 291 may provide a test signal to the transmission line 322 that is selectively communicatively coupled to an input of the power amplifier 330. The signal source 291 may be implemented by a combination of synthesizers, such as the synthesizers 460, 462, and the mixer 464. The controller 290, the synthesizers 460, 462, and the mixer 464 may comprise means for providing the test signal to the transmission line.

At stage 620, the method 600 includes providing the test signal from the transmission line to an LNA input of an LNA of a second transceiver subcircuit of the transceiver integrated circuit substrate. For example, the feedback circuit 260 may provide the test signal, tapped from the transmission line 232 (or the transmission line 322) to an input of the LNA 247. The feedback circuit 260 may provide means for providing the test signal from the transmission line to the LNA input.

At stage 630, the method 600 includes measuring the test signal before amplification by the LNA, or after amplification by the LNA, or both. For example, the test circuitry 292 may measure the test signal before and/or after amplification by the LNA 247. For example, the signal measurement device 548 may measure the test signal as received by the coupler 544 before amplification by the LNA 536 and/or the signal measurement device 550 may measure the test signal after amplification by the LNA 536. The test circuitry 292, e.g., the signal measurement device 548 and/or the signal measurement device 550 may comprise means for measuring the test signal.

Implementations of the method 600 may include one or more of the following features. In an example implementation, the method 600 includes inhibiting, concurrently with providing the test signal from the transmission line to the LNA, the power amplifier from providing an output signal based on the test signal. Inhibiting the power amplifier from providing the output signal based on the test signal may, for example, comprise causing the power amplifier to be off and concurrently causing the test signal to be provided. The controller 290, in combination with the power amplifier 226, may comprise means for inhibiting the power amplifier from providing an output signal to the power-amplifier input based on the test signal. Inhibiting the power amplifier from providing the output signal based on the test signal may, as another example, comprise disconnecting the transmission line from the input of the power amplifier. For example, the controller 290 may cause the switch 310 to disconnect the transmission line 322 from the power amplifier 330 to prevent the test signal from reaching the power amplifier 330 and thus to prevent the power amplifier 330 from providing an output signal based on the test signal. The controller 290, in combination with the switch 310, may comprise means for inhibiting the power amplifier from providing an output signal to the power-amplifier input based on the test signal.

IMPLEMENTATION EXAMPLES

Implementation examples are provided in the following numbered clauses.

Clause 1. A transceiver integrated circuit substrate with built-in self-test circuitry, the transceiver integrated circuit substrate comprising:
  a transmission-signal source configured to produce a test signal;
  a first transceiver subcircuit including a power amplifier that includes a power-amplifier input that is communicatively coupled, or selectively communicatively coupled, to a transmission line that is communicatively coupled to the transmission-signal source to receive the test signal and that includes a power-amplifier output communicatively coupled to a first input/output of the transceiver integrated circuit substrate;
  a second transceiver subcircuit including a low-noise amplifier (LNA) that includes an LNA input communicatively coupled to a second input/output of the transceiver integrated circuit substrate;
  a feedback circuit that is configured to selectively communicatively couple the transmission line to the LNA input of the second transceiver subcircuit;
  test circuitry communicatively coupled to the LNA input of the second transceiver subcircuit, or communicatively coupled to an LNA output of the LNA of the second transceiver subcircuit, or a receive chain intermediate frequency output, or any combination of two or more thereof; and
  a controller communicatively coupled to the transmission-signal source, the first transceiver subcircuit, the second transceiver subcircuit, and the feedback circuit, and configured to cause the feedback circuit to communicatively couple the transmission line of the first transceiver subcircuit to the LNA input of the second transceiver subcircuit.

Clause 2. The transceiver integrated circuit substrate with built-in self-test circuitry of clause 1, wherein the controller is further configured to inhibit the power amplifier from providing an output signal to the power-amplifier output based on the test signal and, concurrently, cause the feedback circuit to communicatively couple the transmission line to the LNA input of the second transceiver subcircuit to provide the test signal to the LNA of the second transceiver subcircuit.

Clause 3. The transceiver integrated circuit substrate with built-in self-test circuitry of clause 2, wherein to inhibit the power amplifier from providing the output signal to the power-amplifier output based on the test signal the controller is configured to cause the power amplifier to be off.

Clause 4. The transceiver integrated circuit substrate with built-in self-test circuitry of clause 2, wherein to inhibit the power amplifier from providing the output signal to the power-amplifier output based on the test signal the controller is configured to disconnect the transmission line from the power-amplifier input.

Clause 5. The transceiver integrated circuit substrate with built-in self-test circuitry of any of clauses 1-4, wherein the power amplifier is disposed in close proximity to a first edge of the transceiver integrated circuit substrate and the LNA is disposed in close proximity to a second edge of the transceiver integrated circuit substrate that is distinct from the first edge of the transceiver integrated circuit substrate.

Clause 6. The transceiver integrated circuit substrate with built-in self-test circuitry of clause 5, wherein the first edge of the transceiver integrated circuit substrate is an opposite edge of the transceiver integrated circuit substrate relative to the second edge of the transceiver integrated circuit substrate.

Clause 7. The transceiver integrated circuit substrate with built-in self-test circuitry of either of clause 5 or clause 6, wherein the feedback circuit extends proximate to a perimeter of the transceiver integrated circuit substrate.

Clause 8. The transceiver integrated circuit substrate with built-in self-test circuitry of any of clauses 1-7, wherein the feedback circuit is configured to selectively communicatively couple the transmission line of the first transceiver subcircuit to the LNA input of the second transceiver subcircuit without extending between the first transceiver subcircuit and the second transceiver subcircuit.

Clause 9. The transceiver integrated circuit substrate with built-in self-test circuitry of any of clauses 1-8, wherein the test circuitry comprises a signal measurement device communicatively coupled to the LNA input.

Clause 10. The transceiver integrated circuit substrate with built-in self-test circuitry of any of clauses 1-9, wherein the signal measurement device is coupled to measure an outgoing signal from a power amplifier of the second transceiver subcircuit.

Clause 11. The transceiver integrated circuit substrate with built-in self-test circuitry of clause 1, wherein the test circuitry comprises a signal measurement device communicatively coupled to the LNA output of the LNA.

Clause 12. The transceiver integrated circuit substrate with built-in self-test circuitry of any of clauses 1-11, wherein the first transceiver subcircuit includes a phase shifter coupled to the transmission line and the feedback circuit is coupled to the transmission line between the phase shifter and the power amplifier.

Clause 13. The transceiver integrated circuit substrate with built-in self-test circuitry of any of clauses 1-12, wherein the feedback circuit is a first feedback circuit, the power-amplifier input of the first transceiver subcircuit is a first power-amplifier input, and the LNA input of the second transceiver subcircuit is a first LNA input, the transceiver integrated circuit substrate further comprising a second feedback circuit that is configured to selectively communicatively couple a second transmission line at least selectively coupled to a second power-amplifier input of the second transceiver subcircuit to a second LNA input of the first transceiver subcircuit.

Clause 14. The transceiver integrated circuit substrate with built-in self-test circuitry of any of clauses 1-13, wherein the test circuitry is configured to determine a receive gain of the second transceiver subcircuit.

Clause 15. The transceiver integrated circuit substrate with built-in self-test circuitry of any of clauses 1-14, wherein the first transceiver subcircuit comprises a portion of first polarization circuitry configured to process signals corresponding to a first polarization, and the second transceiver subcircuit comprises a portion of second polarization circuitry configured to process signals corresponding to a second polarization that is different from the first polarization.

Clause 16. The transceiver integrated circuit substrate with built-in self-test circuitry of any of clauses 1-15, wherein the transmission line is a first transmission line, and wherein the feedback circuit is configured to selectively communicatively couple the first transmission line to a signal measurement device of the second transceiver subcircuit, and to a coupler that is configured to couple the test signal to a second transmission line, of the second transceiver subcircuit, that is communicatively coupled to the LNA input of the second transceiver subcircuit.

Clause 17. The transceiver integrated circuit substrate with built-in self-test circuitry of any of clauses 1-16, wherein the feedback circuit comprises a shunt switch configured to tune an impedance to adjust a signal strength of the test signal provided to the LNA input.

Clause 18. The transceiver integrated circuit substrate with built-in self-test circuitry of any of clauses 1-17, wherein the feedback circuit is configured to selectively communicatively couple the transmission line to one or more of a plurality of LNA inputs of the second transceiver subcircuit.

Clause 19. The transceiver integrated circuit substrate with built-in self-test circuitry of any of clauses 1-18, wherein the feedback circuit comprises one or more amplifiers.

Clause 20. The transceiver integrated circuit substrate with built-in self-test circuitry of any of clauses 1-19, further comprising a third transceiver subcircuit, wherein the first transceiver subcircuit and the second transceiver subcircuit are configured to transmit and receive signals in a first frequency band, and wherein the transmission-signal source comprises a synthesizer corresponding to the third transceiver subcircuit, and wherein the third transceiver subcircuit is configured to transmit and receive second signals in a second frequency band that is separate from the first frequency band.

Clause 21. A method of self-testing a transceiver integrated circuit substrate, the method comprising:
   providing a test signal to a transmission line that is communicatively coupled, or selectively communicatively coupled, to an input of a power amplifier of a first transceiver subcircuit of the transceiver integrated circuit substrate;
   providing the test signal from the transmission line to a low-noise amplifier input (LNA input) of an LNA of a second transceiver subcircuit of the transceiver integrated circuit substrate; and
   measuring the test signal before amplification by the LNA, or after amplification by the LNA, or both.

Clause 22. The method of self-testing a transceiver integrated circuit substrate of clause 21, further comprising inhibiting, concurrently with providing the test signal from the transmission line to the LNA, the power amplifier from providing an output signal based on the test signal.

Clause 23. The method of self-testing a transceiver integrated circuit substrate of clause 22, wherein inhibiting the power amplifier from providing the output signal based on the test signal comprises causing the power amplifier to be off.

Clause 24. The method of self-testing a transceiver integrated circuit substrate of clause 22, wherein inhibiting the power amplifier from providing the output signal based on the test signal comprises disconnecting the transmission line from the input of the power amplifier.

Clause 25. The method of self-testing a transceiver integrated circuit substrate of any of clauses 21-24, wherein the first transceiver subcircuit and the second transceiver subcircuit are configured to transmit and receive signals in a first frequency band, and wherein providing the test signal to the transmission line comprises synthesizing the test signal from a third transceiver subcircuit, of the transceiver integrated circuit substrate, that is configured to transmit and receive second signals in a second frequency band that is separate from the first frequency band.

Clause 26. The method of self-testing a transceiver integrated circuit substrate of any of clauses 21-25, wherein providing the test signal from the transmission line to the LNA input comprises coupling the test signal to the LNA input using a power amplifier coupler of the second transceiver subcircuit.

Clause 27. The method of self-testing a transceiver integrated circuit substrate of any of clauses 21-26, wherein the test signal is measured by a signal measurement unit connected to an intermediate frequency output that is communicatively coupled to an output of the LNA by receive circuitry.

Clause 28. The method of self-testing a transceiver integrated circuit substrate of any of clauses 21-27, wherein the test signal is provided through normal-operation transmit circuitry and normal-operation receive circuitry before being measured in order to test both the normal-operation transmit circuitry and the normal-operation receive circuitry.

Clause 29. A transceiver integrated circuit substrate with built-in self-test circuitry, the transceiver integrated circuit substrate comprising:
   means for providing a test signal to a transmission line that is communicatively coupled, or selectively communicatively coupled, to an input of a power amplifier of a first transceiver subcircuit of the transceiver integrated circuit substrate;
   means for providing the test signal from the transmission line to a low-noise amplifier input (LNA input) of an LNA of a second transceiver subcircuit of the transceiver integrated circuit substrate; and
   means for measuring the test signal before amplification by the LNA, or after amplification by the LNA, or both.

Clause 30. The transceiver integrated circuit substrate with built-in self-test circuitry of clause 29, further comprising means for inhibiting, concurrently with providing the test signal from the transmission line to the LNA, the power amplifier from providing an output signal based on the test signal.

Clause 31. The transceiver integrated circuit substrate with built-in self-test circuitry of clause 30, wherein the means for inhibiting the power amplifier from providing the output signal based on the test signal comprise means for causing the power amplifier to be off.

Clause 32. The transceiver integrated circuit substrate with built-in self-test circuitry of clause 30, wherein the means for inhibiting the power amplifier from providing the output signal based on the test signal comprise means for disconnecting the transmission line from the input of the power amplifier.

Clause 33. The transceiver integrated circuit substrate with built-in self-test circuitry of any of clauses 29-32, wherein the first transceiver subcircuit and the second transceiver subcircuit are configured to transmit and receive signals in a first frequency band, and wherein the means for providing the test signal to the transmission line comprise means for synthesizing the test signal from a third transceiver subcircuit, of the transceiver integrated circuit substrate, that is configured to transmit and receive second signals in a second frequency band that is separate from the first frequency band.

Clause 34. The transceiver integrated circuit substrate with built-in self-test circuitry of any of clauses 29-33, wherein the means for providing the test signal from the transmission line to the LNA input comprise means for coupling the test signal to the LNA input using a power amplifier coupler of the second transceiver subcircuit.

Clause 35. The transceiver integrated circuit substrate with built-in self-test circuitry of any of clauses 29-34, wherein the means for measuring the test signal are connected to an intermediate frequency output that is communicatively coupled to an output of the LNA by receive circuitry.

Clause 36. A non-transitory, processor-readable storage medium comprising processor-readable instructions to cause one or more processors, of a transceiver integrated circuit substrate with built-in self-test circuitry, to:

cause a signal source to provide a test signal to a transmission line that is communicatively coupled, or selectively communicatively coupled, to an input of a power amplifier of a first transceiver subcircuit of the transceiver integrated circuit substrate; and cause a feedback circuit to provide the test signal from the transmission line to a low-noise amplifier input (LNA input) of an LNA of a second transceiver subcircuit of the transceiver integrated circuit substrate.

Clause 37. The non-transitory, processor-readable storage medium of clause 36, further comprising processor-readable instructions to cause the one or more processors to inhibit, concurrently with the test signal be provided from the transmission line to the LNA, the power amplifier from providing an output signal based on the test signal.

Clause 38. The non-transitory, processor-readable storage medium of clause 37, wherein the processor-readable instructions to cause the one or more processors to inhibit the power amplifier from providing the output signal based on the test signal comprise processor-readable instructions to cause the one or more processors to cause the power amplifier to be off.

Clause 39. The non-transitory, processor-readable storage medium of clause 37, wherein the processor-readable instructions to cause the one or more processors to inhibit the power amplifier from providing the output signal based on the test signal comprise processor-readable instructions to cause the one or more processors to disconnect the transmission line from the input of the power amplifier.

OTHER CONSIDERATIONS

Other examples and implementations are within the scope of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

As used herein, the singular forms "a," "an," and "the" include the plural forms as well, unless the context clearly indicates otherwise. Thus, reference to a device in the singular (e.g., "a device," "the device"), including in the claims, includes one or more of such devices (e.g., "a processor" includes one or more processors, "the processor" includes one or more processors, "a memory" includes one or more memories, "the memory" includes one or more memories, etc.). The terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Also, as used herein, "or" as used in a list of items (possibly prefaced by "at least one of" or prefaced by "one or more of") indicates a disjunctive list such that, for example, a list of "at least one of A, B, or C," or a list of "one or more of A, B, or C" or a list of "A or B or C" means A, or B, or C, or AB (A and B), or AC (A and C), or BC (B and C), or ABC (i.e., A and B and C), or combinations with more than one feature (e.g., AA, AAB, ABBC, etc.). Thus, a recitation that an item, e.g., a processor, is configured to perform a function regarding at least one of A or B, or a recitation that an item is configured to perform a function A or a function B, means that the item may be configured to perform the function regarding A, or may be configured to perform the function regarding B, or may be configured to perform the function regarding A and B. For example, a phrase of "a processor configured to measure at least one of A or B" or "a processor configured to measure A or measure B" means that the processor may be configured to measure A (and may or may not be configured to measure B), or may be configured to measure B (and may or may not be configured to measure A), or may be configured to measure A and measure B (and may be configured to select which, or both, of A and B to measure). Similarly, a recitation of a means for measuring at least one of A or B includes means for measuring A (which may or may not be able to measure B), or means for measuring B (and may or may not be configured to measure A), or means for measuring A and B (which may be able to select which, or both, of A and B to measure). As another example, a recitation that an item, e.g., a processor, is configured to at least one of perform function X or perform function Y means that the item may be configured to perform the function X, or may be configured to perform the function Y, or may be configured to perform the function X and to perform the function Y. For example, a phrase of "a processor configured to at least one of measure X or measure Y" means that the processor may be configured to measure X (and may or may not be configured to measure Y), or may be configured to measure Y (and may or may not be configured to measure X), or may be configured to measure X and to measure Y (and may be configured to select which, or both, of X and Y to measure).

As used herein, unless otherwise stated, a statement that a function or operation is "based on" an item or condition means that the function or operation is based on the stated item or condition and may be based on one or more items and/or conditions in addition to the stated item or condition.

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed. Components, functional or otherwise, shown in the figures and/or discussed herein as being connected or communicating with each other are communicatively coupled unless otherwise noted. That is, they may be directly or indirectly connected to enable communication between them.

The systems and devices discussed above are examples. Various configurations may omit, substitute, or add various procedures or components as appropriate. For instance, features described with respect to certain configurations may be combined in various other configurations. Different aspects and elements of the configurations may be combined in a similar manner. Also, technology evolves and, thus, many of the elements are examples and do not limit the scope of the disclosure or claims.

A wireless communication system is one in which communications are conveyed wirelessly, i.e., by electromagnetic and/or acoustic waves propagating through atmospheric space rather than through a wire or other physical connection, between wireless communication devices. A wireless communication system (also called a wireless communications system, a wireless communication network, or a wireless communications network) may not have all communications transmitted wirelessly, but is configured to have at least some communications transmitted wirelessly. Further, the term "wireless communication device," or similar term, does not require that the functionality of the device is exclusively, or even primarily, for communication, or that communication using the wireless communication device is exclusively, or even primarily, wireless, or that the device be a mobile device, but indicates that the device includes wireless communication capability (one-way or two-way), e.g., includes at least one radio (each radio being part of a transmitter, receiver, or transceiver) for wireless communication.

Specific details are given in the description herein to provide a thorough understanding of example configurations (including implementations). However, configurations may be practiced without these specific details. For example, well-known circuits, processes, algorithms, structures, and techniques have been shown without unnecessary detail in order to avoid obscuring the configurations. The description herein provides example configurations, and does not limit the scope, applicability, or configurations of the claims. Rather, the preceding description of the configurations provides a description for implementing described techniques. Various changes may be made in the function and arrangement of elements.

The terms "processor-readable medium," "machine-readable medium," and "computer-readable medium," as used herein, refer to any medium that participates in providing data that causes a machine to operate in a specific fashion. Using a computing platform, various processor-readable media might be involved in providing instructions/code to processor(s) for execution and/or might be used to store and/or carry such instructions/code (e.g., as signals). In many implementations, a processor-readable medium is a physical and/or tangible storage medium. Such a medium may take many forms, including but not limited to, non-volatile media and volatile media. Non-volatile media include, for example, optical and/or magnetic disks. Volatile media include, without limitation, dynamic memory.

Having described several example configurations, various modifications, alternative constructions, and equivalents may be used. For example, the above elements may be components of a larger system, wherein other rules may take precedence over or otherwise modify the application of the disclosure. Also, a number of operations may be undertaken before, during, or after the above elements are considered. Accordingly, the above description does not bound the scope of the claims.

Unless otherwise indicated, "about" and/or "approximately" as used herein when referring to a measurable value such as an amount, a temporal duration, and the like, encompasses variations of ±20% or ±10%, ±5%, or ±0.1% from the specified value, as appropriate in the context of the systems, devices, circuits, methods, and other implementations described herein. Unless otherwise indicated, "substantially" as used herein when referring to a measurable value such as an amount, a temporal duration, a physical attribute (such as frequency), and the like, also encompasses variations of ±20% or ±10%, ±5%, or ±0.1% from the specified value, as appropriate in the context of the systems, devices, circuits, methods, and other implementations described herein.

A statement that a value exceeds (or is more than or above) a first threshold value is equivalent to a statement that the value meets or exceeds a second threshold value that is slightly greater than the first threshold value, e.g., the second threshold value being one value higher than the first threshold value in the resolution of a computing system. A statement that a value is less than (or is within or below) a first threshold value is equivalent to a statement that the value is less than or equal to a second threshold value that is slightly lower than the first threshold value, e.g., the second threshold value being one value lower than the first threshold value in the resolution of a computing system.

The invention claimed is:

1. A transceiver integrated circuit substrate with built-in self-test circuitry, the transceiver integrated circuit substrate comprising:

a transmission-signal source configured to produce a test signal;

a first transceiver subcircuit including a power amplifier that includes: a power-amplifier input that is communicatively coupled, or selectively communicatively coupled, to a transmission line that is communicatively coupled to the transmission-signal source to receive the test signal; and a power-amplifier output communicatively coupled to a first input/output of the transceiver integrated circuit substrate;

a second transceiver subcircuit including a low-noise amplifier (LNA) that includes an LNA input communicatively coupled to a second input/output of the transceiver integrated circuit substrate;

a feedback circuit that is configured to selectively communicatively couple the transmission line to the LNA input of the second transceiver subcircuit;

test circuitry communicatively coupled to the LNA input of the second transceiver subcircuit, or communicatively coupled to an LNA output of the LNA of the second transceiver subcircuit, or a receive chain intermediate frequency output, or any combination of two or more thereof; and a controller communicatively coupled to the transmission-signal source, the first transceiver subcircuit, the second transceiver subcircuit, and the feedback circuit, wherein the controller is configured to cause the feedback circuit to communicatively couple the transmission line of the first transceiver subcircuit to the LNA input of the second transceiver subcircuit.

2. The transceiver integrated circuit substrate with built-in self-test circuitry of claim 1, wherein the controller is further configured to inhibit the power amplifier from providing an output signal to the power-amplifier output based on the test signal and, concurrently, cause the feedback circuit to communicatively couple the transmission line to the LNA input of the second transceiver subcircuit to provide the test signal to the LNA of the second transceiver subcircuit.

3. The transceiver integrated circuit substrate with built-in self-test circuitry of claim 2, wherein to inhibit the power amplifier from providing the output signal to the power-amplifier output based on the test signal the controller is configured to cause the power amplifier to be off.

4. The transceiver integrated circuit substrate with built-in self-test circuitry of claim 2, wherein to inhibit the power amplifier from providing the output signal to the power-amplifier output based on the test signal the controller is configured to disconnect the transmission line from the power-amplifier input.

5. The transceiver integrated circuit substrate with built-in self-test circuitry of claim 1, wherein the power amplifier is disposed in close proximity to a first edge of the transceiver integrated circuit substrate and the LNA of the second transceiver subcircuit is disposed in close proximity to a second edge of the transceiver integrated circuit substrate that is distinct from the first edge of the transceiver integrated circuit substrate.

6. The transceiver integrated circuit substrate with built-in self-test circuitry of claim 5, wherein the first edge of the transceiver integrated circuit substrate is an opposite edge of the transceiver integrated circuit substrate relative to the second edge of the transceiver integrated circuit substrate.

7. The transceiver integrated circuit substrate with built-in self-test circuitry of claim 5, wherein the feedback circuit extends proximate to a perimeter of the transceiver integrated circuit substrate.

8. The transceiver integrated circuit substrate with built-in self-test circuitry of claim 1, wherein the feedback circuit is configured to selectively communicatively couple the transmission line of the first transceiver subcircuit to the LNA input of the second transceiver subcircuit without extending between the first transceiver subcircuit and the second transceiver subcircuit.

9. The transceiver integrated circuit substrate with built-in self-test circuitry of claim 1, wherein the test circuitry comprises a signal measurement device communicatively coupled to the LNA input of the second transceiver subcircuit.

10. The transceiver integrated circuit substrate with built-in self-test circuitry of claim 9, wherein the power amplifier of the first transceiver subcircuit is a first power amplifier, and wherein the signal measurement device is coupled to measure an outgoing signal from a second power amplifier of the second transceiver subcircuit.

11. The transceiver integrated circuit substrate with built-in self-test circuitry of claim 1, wherein the test circuitry comprises a signal measurement device communicatively coupled to the LNA output of the LNA of the second transceiver subcircuit.

12. The transceiver integrated circuit substrate with built-in self-test circuitry of claim 1, wherein the first transceiver subcircuit includes a phase shifter coupled to the transmission line and the feedback circuit is coupled to the transmission line between the phase shifter and the power amplifier.

13. The transceiver integrated circuit substrate with built-in self-test circuitry of claim 1, wherein the feedback circuit is a first feedback circuit, the power-amplifier input of the first transceiver subcircuit is a first power-amplifier input, and the LNA input of the second transceiver subcircuit is a first LNA input, the transceiver integrated circuit substrate further comprising a second feedback circuit that is configured to selectively communicatively couple a second transmission line at least selectively coupled to a second power-amplifier input of the second transceiver subcircuit to a second LNA input of the first transceiver subcircuit.

14. The transceiver integrated circuit substrate with built-in self-test circuitry of claim 1, wherein the test circuitry is configured to determine a receive gain of the second transceiver subcircuit.

15. The transceiver integrated circuit substrate with built-in self-test circuitry of claim 1, wherein the first transceiver subcircuit comprises a portion of first polarization circuitry configured to process signals corresponding to a first polarization, and the second transceiver subcircuit comprises a portion of second polarization circuitry configured to process signals corresponding to a second polarization that is different from the first polarization.

16. The transceiver integrated circuit substrate with built-in self-test circuitry of claim 1, wherein the transmission line is a first transmission line, and wherein the feedback circuit is configured to selectively communicatively couple the first transmission line to a signal measurement device of the second transceiver subcircuit, and to a coupler that is configured to couple the test signal to a second transmission line, of the second transceiver subcircuit, that is communicatively coupled to the LNA input of the second transceiver subcircuit.

17. The transceiver integrated circuit substrate with built-in self-test circuitry of claim 1, wherein the feedback circuit comprises a shunt switch configured to tune an impedance to adjust a signal strength of the test signal provided to the LNA input of the second transceiver subcircuit.

18. The transceiver integrated circuit substrate with built-in self-test circuitry of claim 1, wherein the feedback circuit is configured to selectively communicatively couple the transmission line to one or more of a plurality of LNA inputs of the second transceiver subcircuit.

* * * * *